US006331452B1

(12) United States Patent
Gall

(10) Patent No.: US 6,331,452 B1
(45) Date of Patent: Dec. 18, 2001

(54) METHOD OF FABRICATING INTEGRATED CIRCUIT PACKAGE WITH OPENING ALLOWING ACCESS TO DIE

(75) Inventor: Peter J. Gall, Mountaun View, CA (US)

(73) Assignee: Verdicom, Inc., Santa Clara, CA (US)

( * ) Notice: Subject to any disclaimer, the term of this patent is extended or adjusted under 35 U.S.C. 154(b) by 0 days.

(21) Appl. No.: 09/290,456

(22) Filed: Apr. 12, 1999

(51) Int. Cl.⁷ .................................................. H01L 21/48
(52) U.S. Cl. ......................... 438/127; 438/123; 438/124; 438/119
(58) Field of Search ..................................... 438/119, 116, 438/118, 121, 122, 123, 125, 124, 126, 127, 106; 361/820; 257/680, 698

(56) References Cited

U.S. PATENT DOCUMENTS

| | | |
|---|---|---|
| 5,819,403 | 10/1998 | Crane, Jr. et al. ...................... 29/841 |
| 5,824,950 | 10/1998 | Mosley et al. ........................ 174/52.4 |
| 5,862,248 | 1/1999 | Salatino et al. ....................... 382/124 |
| 5,895,222 | * 4/1999 | Moden et al. . |
| 6,246,566 | * 6/2001 | Glenn . |

* cited by examiner

Primary Examiner—Charles Bowers
Assistant Examiner—Evan Pert
(74) Attorney, Agent, or Firm—Lyon & Lyon LLP

(57) ABSTRACT

An I.C. die is mounted on a base of an open-tooled package. The open-tooled package comprises a substrate, the substrate having a base, a plurality of sidewalls, and a plurality of leads extending through at least one of the sidewalls. A cavity is formed between the sidewalls of the open-tooled package and the sidewalls of the I.C, die. Electrical connections are made between a plurality of bond pads on said I.C. die and their corresponding leads of said open-tooled package. A first portion of the cavity, enclosing the I.C. die, is filled with a non-conductive material and a second portion of the cavity is filled with a conductive material. In one embodiment, the first portion of the cavity contains leads having electrical connection to the I.C. die and the second portion of the cavity contains leads having electrical connection to ground potential. A conductive ring is attached to the open-tooled package through the conductive material, which shorts leads in the second portion of the cavity, to provide electrostatic protection to the I.C. die.

27 Claims, 9 Drawing Sheets

METHOD OF FABRICATING INTEGRATED CIRCUIT PACKAGE WITH OPENING ALLOWING ACCESS TO DIE

FIELD OF THE INVENTION

This invention relates to integrated circuit (I.C.) die packaging. More particularly, this invention relates to an I.C. die package that allows direct interface between the I.C. die and its external environment, and methods of manufacturing the package.

BACKGROUND OF THE INVENTION

Packaging of electronic circuits is the science and the art of establishing interconnections and a suitable operating environment for the circuits to process or store information. The packaging must reconcile and satisfy application requirements with respect to cost, performance, and reliability, as well as constraints imposed by the laws of nature and the properties of materials and processes. Generally, environmental conditions such as temperature extremes, high relative humidity, mechanical shock and vibrations, electromagnetic fields, electrostatic discharges, and nuclear radiation may contribute to failures of electronic packages.

Currently, there are many different shapes and sizes of semiconductor packages available, including laminated ceramic, pressed ceramic, and molded plastic packages. In accordance with the laminated ceramic technology, a semiconductor die is attached to a ceramic package having leads extending from a lead frame. Bonding pads on the die are connected to the leads using bonding wires. A cap is then soldered to the ceramic package, thereby sealing the die and inner portions of the leads within the package.

In pressed ceramic technology, a semiconductor die is attached to a lower portion of a ceramic package having leads extending from a lead frame. After the wire bonding procedure, a top portion of the ceramic package is soldered to the lower portion of the ceramic package to seal the die and the inner portions of the leads within the package. Ceramic packaging is relatively expensive and the ceramic material causes a relatively large inductance, thus slowing down the signal propagation through the device.

With molded plastic technology, a semiconductor die is configured for housing within a plastic package from which a set of leads will extend. FIGS. 1 through 5 and 6A–6C illustrate the general process flow for a plastic molded I.C. package assembly. FIG. 1 shows a conventional lead frame 10 having outwardly extending leads 12. Lead frame 10 is the central supporting structure of the package to which every other element is attached. Etched or stamped from a thin sheet-metal strip into a filigree of narrow beams that radiate from a center platform, lead frame 10 carries the chip throughout the assembly process and becomes an integral part of the package after molding.

An I.C. die 14 is attached to lead frame 10 with a conductive adhesive 16, as shown in FIG. 2. FIG. 3 shows I.C. die 14 electrically connected to the radiating beams (not shown) of lead frame 10 with fine-diameter bond wires 20 between bond pad 18 on I.C. die 14 and bond pad 19 on lead frame 10, bond pad 19 being electrically coupled to one of the leads 12. This assembly of I.C. die 14, bond wires 20, and lead frame 10 is placed in an injection molding device 22 that has a cavity 24 and an opening 26 for injecting a molding compound into cavity 24, as shown in FIG. 4. I.C. die 14, bond wires 20, and lead frame 10 are covered with the molding compound during the injection molding process, which is carried out at a high temperature. Conventional materials used for the molding compounds are novolac-based molding compounds.

Injection molding device 22 is pulled apart, leaving a plastic package 28 with leads 12 extending from plastic package 28, as shown in FIG. 5. Leads 12 are trimmed, formed, and tin-plated to complete the package. FIG. 6A shows leads 12 formed into butt joint leads 12a. FIG. 6B shows leads 12 formed into J-leads 12b. FIG. 6C shows leads 12 formed into gull wing leads 12c.

The various packaging structures and methods described above may be sufficient for a traditional I.C. die. However, in the field of biometric identification, e.g., fingerprint identification, where the surface of the I.C. die must directly interface with its external environment, e.g., the finger, such structures and methodologies are incompatible because the I.C. die is encapsulated in various ways in the package. Efforts have been made to build an I.C. die package that leaves open the surface of the chip. One example is the package described in U.S. Pat. No. 5,862,248 (hereinafter, the '248 patent) issued on Jan. 19, 1999, to Salatino et al. and assigned to Harris Corporation, which is incorporated by reference herein in its entirety.

The '248 patent describes an integrated circuit device having an opening exposing the integrated circuit die to the sensed medium, such as a finger, and related methods. In particular, the '248 patent describes a package that includes an integrated circuit die 54 mounted on a lead frame 50 during injection molding to form the body of encapsulating material of the package, as shown in FIG. 7. Electrical connections are made by bond wires 60 between bond pads 58 on I.D. die 54 and bond pads 59 on lead frame 50, each of bond pads 59 is electrically coupled to corresponding outwardly extending leads 65. The upper surface of the package includes an integrally molded opening 70 that directly permits contact to integrated circuit die 54.

In the embodiment shown in FIG. 7, the upper mold portion 61 includes a body 62 and a notch 63 extending downwardly from body 62. Upper mold portion 61 is brought into contact with lower mold portion 64 and clamped. Plastic encapsulating material is injected into cavity 68, forming the plastic package. One important drawback for this method is that integrated circuit die 54 may be crushed by the extremely high-pressure associated with such process, even if high-temperature silicon rubber, which is highly compressible, is used as the mold material. Another drawback of the above method is the extreme difficulty in aligning notch 63 to integrated circuit die 54.

A second embodiment of the '248 patent also employs injection molding to build an I.C. die package. As shown in FIG. 8, electrodes 85, a body 82 of dissolvable material, and an adhesive layer 83 on the underside of electrodes 85 are aligned over and positioned onto the integrated circuit die 84 that, in turn, has been secured and connected to lead frame 80. The above structure is positioned within a conventional integrated circuit package injection mold (not shown). After removal from the injection mold, the structure is positioned in a bath 86 containing a liquid solvent 87, so that body 82 of dissolvable material is dissolved away, leaving an opening to the underlying portion of the integrated circuit die 84. This method is undesirable because it requires additional processing steps and is thus more complicated and costly.

The molded plastic technology, in general, has several drawbacks. For example, the molded plastic technology incorporates various processes following the wire bonding procedure that may detrimentally affect the bonding integrity. These processes include sealing, which involves high-pressure injection-molding and cooling/heating steps, and the bending of the leads to achieve desired lead configurations, whereby bonding wire movement, breakage, and/or shorting can all result. Moreover, the encapsulation process is limited to the use of molding compounds with low thermal conductivity that can perform poorly.

Additionally, the use of lead frames during the manufacturing of semiconductor packages has many disadvantages. First, the dies from which conventional lead frames are stamped can be very expensive because of the number of intricate features of the circuit involved and the amount of material that must be handled. Moreover, the manufacturing tolerances required in stamping the larger sizes of necessary elements of the circuit cause the stamping of lead frames to be a low-yield process. Also, packages that incorporate lead frames are typically tested after die placement at a point so late in the manufacturing process that if the package turns out to be defective, any value that may have been added is rendered useless.

Additionally, lead frames typically limit the die placement process to procedures such as single-row peripheral pad bonding or tape automated bonding, thereby limiting die placement options and flexibility. Furthermore, once a conventional semiconductor package is completed, it is very difficult, if not impossible, to carry out repairs on one or more of the components of the package. In general, for conventional packaging technology, as the number of required leads increases, based on increases in the speed and functionality of the relevant die, so does the size of the lead frame, increasing its manufacturing and tooling costs and decreasing its efficiency due to the increased distances the signal must travel.

SUMMARY OF THE INVENTION

In accordance with the invention, structures and methods are provided to construct an I.C. die package that has an opening to allow direct external environmental interaction with the I.C. die, which is physically strong enough to withstand such external environmental interaction, and which is relatively inexpensive.

In accordance with an embodiment, an I.C. die is attached with a sealant material to a prefabricated semiconductor die carrier, i.e., an open-tooled package. The open-tooled package comprises a substrate, the substrate having a base, a plurality of sidewalls, and a plurality of leads extending through at least one of the sidewalls. A cavity is formed between the sidewalls of the open-tooled package and the sidewalls of the I.C. die. Electrical connections are made between a plurality of bond pads on the I.C. die and their corresponding leads of the open-tooled package. A first portion of the cavity, enclosing the I.C. die, is filled with a non-conductive material and a second portion of the cavity is filled with a conductive material. In one embodiment, the first portion of the cavity contains leads having electrical connection to the I.C. die and the second portion of the cavity contains leads having electrical connection to ground potential. A conductive ring is attached to the open-tooled package via the conductive material, which shorts leads in the second portion of the cavity, to provide electrostatic protection to the I.C. die. In one embodiment, the substrate of the open-tooled package further comprises a dam, the dam defining the first and the second portions of the cavity. In one embodiment, a dam is built around the I.C. die to prevent the fill materials from spilling onto the I.C. die.

BRIEF DESCRIPTION OF THE DRAWINGS

Use of the same reference numbers in different figures indicates similar or like elements.

DETAILED DESCRIPTION

The following description is meant to be illustrative only and not limiting. Other embodiments of this invention will be obvious in view of the following description to those skilled in the I.C. die packaging arts.

Figure 9A:
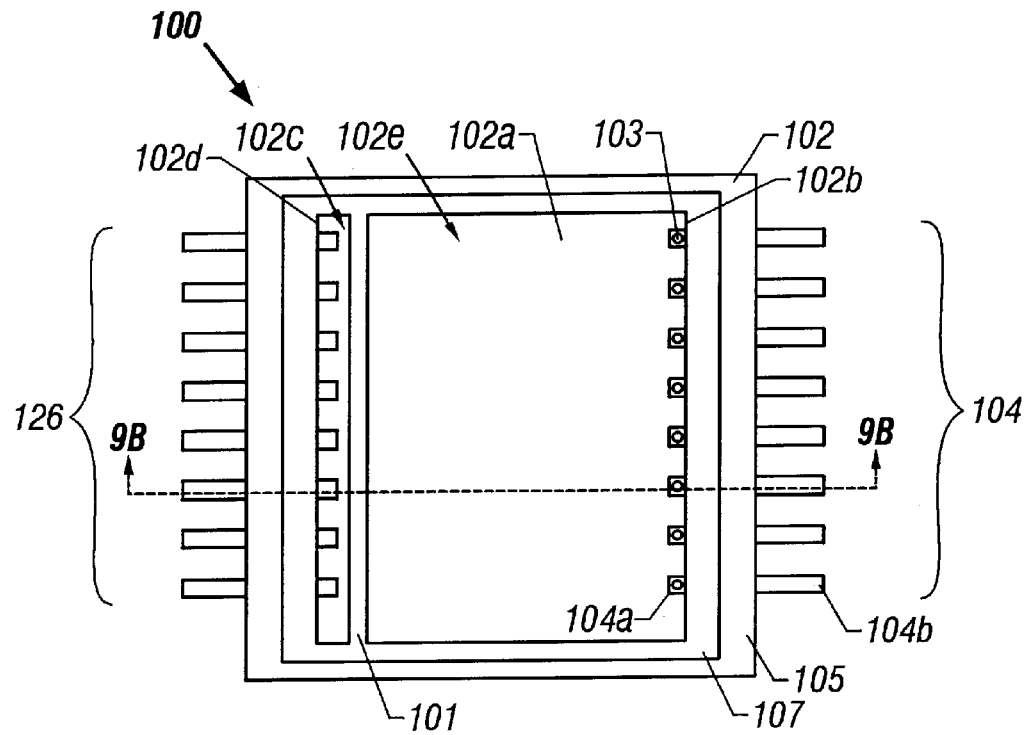
FIG. 9A shows a top view of a VSPA (Veridicom Silicon Polymer Assembly)
Figure 9B:
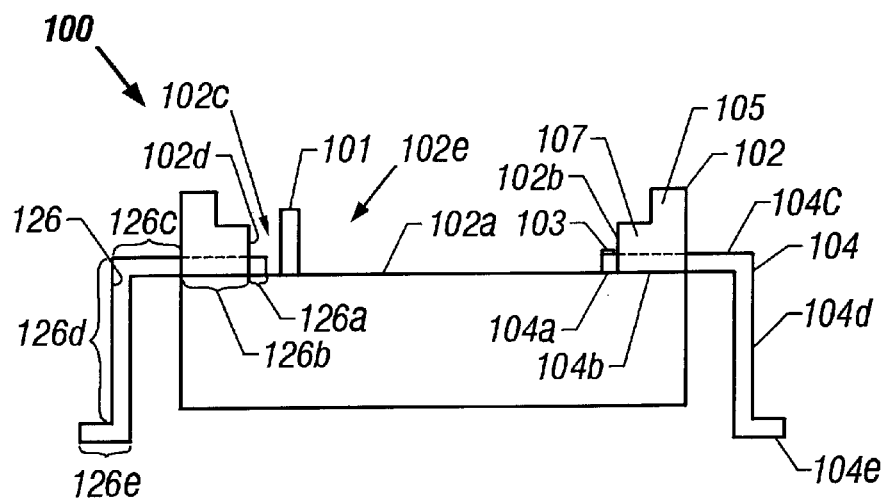
FIG. 9B shows a cross-sectional view of the device shown in FIG. 9A.

FIG. 9A shows a top view of an open-tooled package 100, called the VSPA (Veridicom Silicon Polymer Assembly), manufactured by The Panda Project, Boca Raton, Fla. A cross-sectional view of open-tooled package 100, taken at section A–A' is shown in FIG. 9B. Open-tool package 100 includes an insulating substrate 102 having a base 102a, a dam 101 which defines a cavity 102c having sidewalls 102d and a cavity 102e having sidewalls 102b. A plurality of leads 104 extend through one of sidewalls 102b; a plurality of leads 126 extend through one of sidewalls 102d; and a plurality of bond terminals 103 are formed on leads 104, respectively. While open-tooled package 100 shown is square in shape, it can be other shapes, such a rectangular. Open-tooled package 100 can also have more than four sides and leads may be inserted through any of these sidewalls. Moreover, open-tooled package 100 may have tiered leads, thus is capable of accommodating multiple dies in a single package.

In one embodiment, an insulating substrate 102 is formed in a molding process carried out prior to inserting the leads. During the molding process, a series of lead holes or passages are molded within the sidewalls of insulating substrate 102, each of the passages for receiving a corresponding one of the leads 104 and 126. Each of the leads 104 and 126 is manufactured and assembled into the open-tooled package 100 prior to the die attachment as an individually manufactured lead, rather than as a sub-element of a lead frame. Leads 104 and 126 are inserted into the sidewalls of insulating substrate 102, e.g., individually or "gang-inserted" in groups. Other embodiments for manufacturing insulating substrate 102 and leads 104 and 126 and pin insertion are described in detail in U.S. Pat. No. 5,819,403 (hereinafter the '403 patent), issued on Oct. 13, 1998 to crane et al. and assigned to The Panda Project.

Leads 104 and 126 of open-tooled package 100 extend into open-tooled package 100, forming two banks of multiple leads on two opposite sides of open-tooled package 100. The portions 104a of the first bank of leads 104, extending through sidewall 102b of open-tooled package 100, have wire bond terminals 103 for electrical connection to the I.C. die 106 (shown in FIGS. 10A and 10B). The second bank of leads 126, extending through sidewall 102d into cavity 102c, will be electrically connected to ground potential, as will be discussed later.

Figure 1:
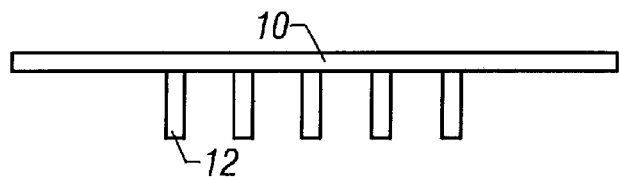
FIG. 1 (prior art) shows a conventional lead frame.
Figure 2:
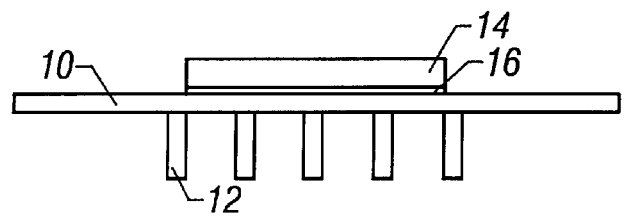
FIG. 2 (prior art) shows an I.C. die attached to a lead frame with a sealant material.
Figure 3:
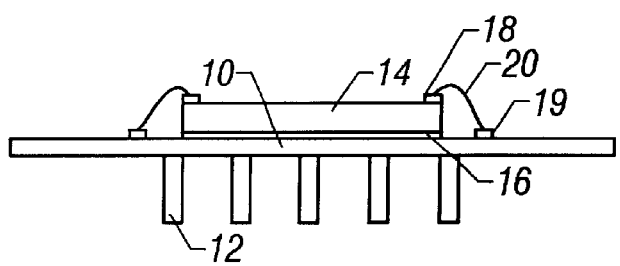
FIG. 3 (prior art) shows bond wires electrically coupling an I.C. die and a lead frame.
Figure 4:
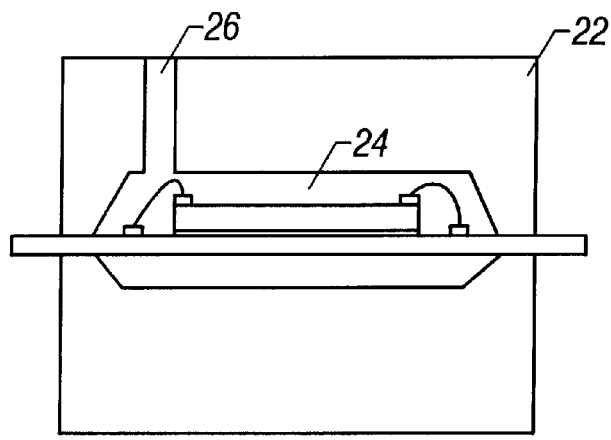
FIG. 4 (prior art) shows an injection molding device enclosing the structure of FIG. 3 and having a cavity and an opening for injecting molding compound into the cavity.
Figure 5:
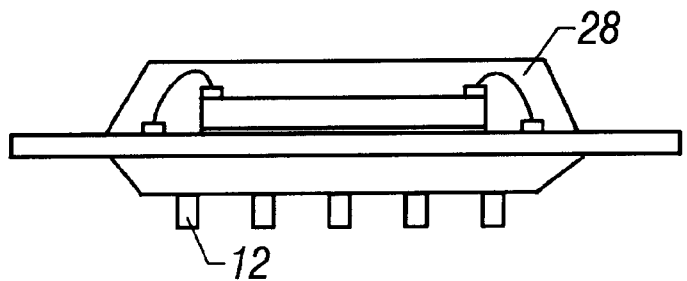
FIG. 5 (prior art) shows an integrally molded body encapsulating the structure of FIG. 3.
Figure 6A:
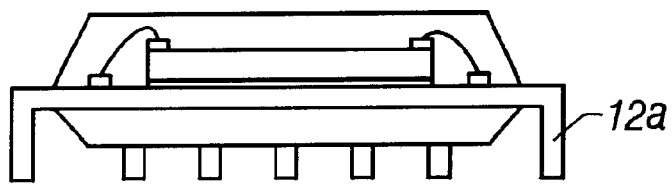
FIGS. 6A through 6C (prior art) show various embodiments of the lead shape.
Figure 6B:
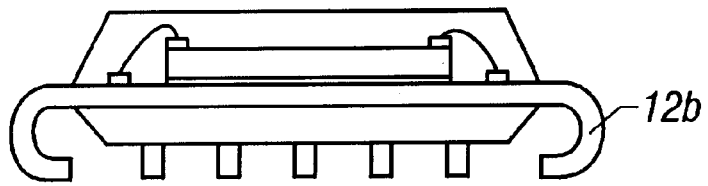
Figure 6C:
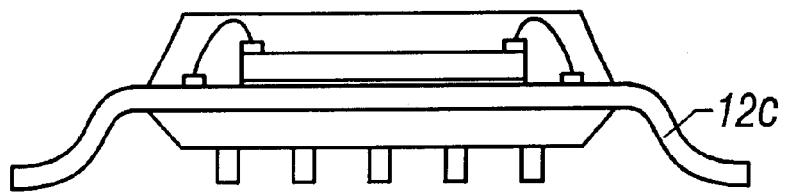
Figure 7:
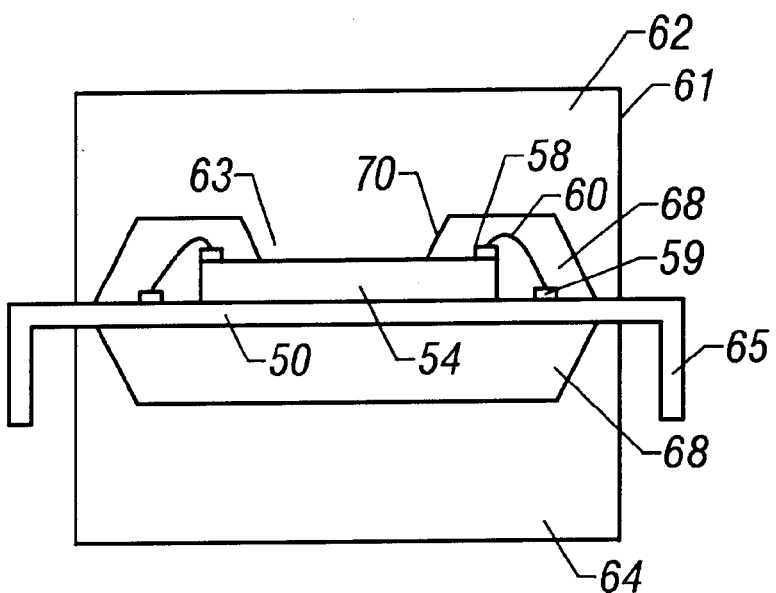
FIG. 7 (prior art) shows an injection molding scheme in making an integrally molded body of encapsulating material and having an opening exposing a surface of the I.C. die by using a mold device having an upper mold portion having a notch protruding from the body of the upper mold portion.
Figure 8:
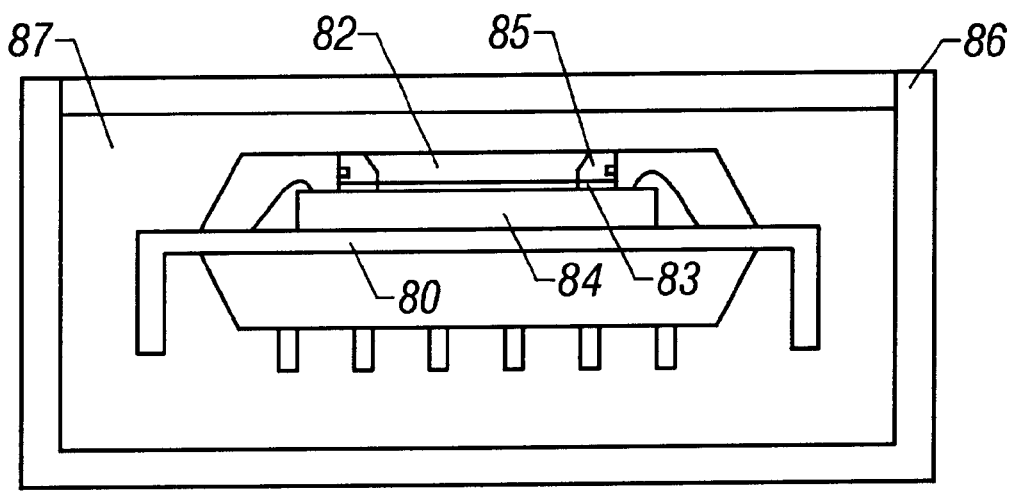
FIG. 8 (prior art) shows an injection molding scheme in making an integrally molded body of encapsulating material and having an opening exposing a surface of the I.C. die by dissolving a dissolvable body of material attached to the surface of the I.C. die.

As shown in FIG. 9B, each of leads 126 includes an internal lead extension section 126a, a stabilizing section 126b, a horizontally extending external lead section 126c, a vertically extending lead section 126d, and a foot section 126e. Internal lead extension sections 126a of the second bank of leads 126 are electrically coupled together through a conductive material, as will be shown below. Foot section 126e is for surface mounting the I.C. package to external circuitry, e.g., a printed circuit board. Similarly, each of leads 104 includes a bonding extension section 104a, a stabilizing section 104b, a horizontally extending external lead section 104c, a vertically extending lead section 104d, and a foot section 104e. Bonding extension section 104a is for electrically connecting open-tooled package 100 to I.C. die 106. The lead configuration described above has a better pull strength then a gull wing lead shown in FIG. 6C. Of course, any lead configurations such as gull wing, J-lead, and butt joint, can be used.

Insulating substrate 102 is preferably made of liquid crystal polymer or a material having thermal and conductive properties that are the same or similar to liquid crystal polymer. In one embodiment, the liquid crystal polymer is VECTRA$^M$, which has a coefficient of thermal expansion that is approximately the same as or similar to the coefficient of thermal expansion for silicon. Therefore, open-tooled package 100 has better thermal capabilities than a conventional lead frame, which is made of a material that has a coefficient of thermal expansion different than silicon. Furthermore, open-tooled package 100 has better electrical properties than a lead frame because open-tooled package 100 has shorter leads than the conventional lead frame, which has an extending plate, as shown in FIGS. 1 through 5, 6A–6C, 7 and 8. Thus, leads 104 and 126 encounter less electrical resistance.

Figure 9C:
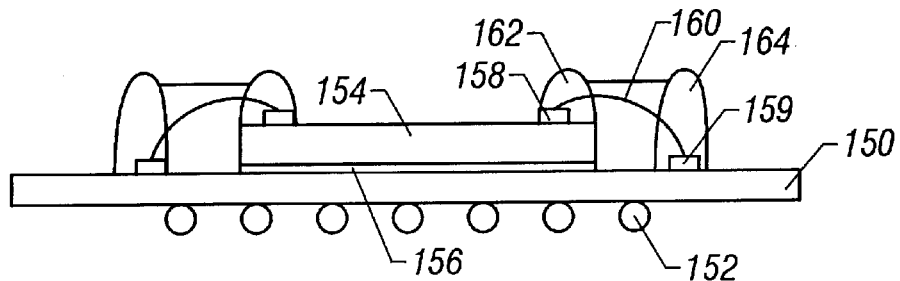
FIG. 9C shows a cross-sectional view of a ball grid array (BGA) package that has an opening to allow direct access to an integrated circuit die.

In addition, liquid crystal polymer forms a very strong package, unlike a ball grid array (BGA) package. A BGA implementation of a package that has an opening to allow access to an I.C. die is shown in FIG. 9C. Solder balls 152 are formed on the bottom surface of a board 150. An I.C. die 154 is attached to board 150 using an adhesive 156. I.C die 154 includes bond pads 158, which are electrically connected to corresponding bond pads 159 on board 150 with bond wires 160. Dams 162 and 164 are formed by depositing a line of beads of a non-conductive material around I.C. die 154 and a line of beads of non-conductive material covering bond pads 159. In one embodiment, the non-conductive material is non-conductive epoxy deposited by a dual-head dispenser such as an Asymtek Century 708 manufactured by Asymtek. The trench between dam 162 and 164 is then filled with a non-conductive material using the same dual-head dispenser, but with a larger dispensing head size. The substrate in a BGA package, e.g., glass, contains voids. Therefore, the surface of the BGA package is not smooth when a die attachment material is deposited. Since a BGA package is very thin, any openings or voids in the substrate or underneath will cause eventual cracks when pressure is applied repeatedly. To further the problem, voids between solder balls 152 further weaken the BGA package. Hence, BGA package is structurally weaker than an open-tooled package.

As can be seen from the cross-sectional view of FIG. 9B, insulating substrate 102 is in a tiered configuration with an outer frame 105 and an inner frame 107. The step formed by frames 105 and 107 provides support for a conductive ring, described below. Dam 101 prevents overspill of a fill material onto the I.C. die attached to base 102a.

Figure 10A:
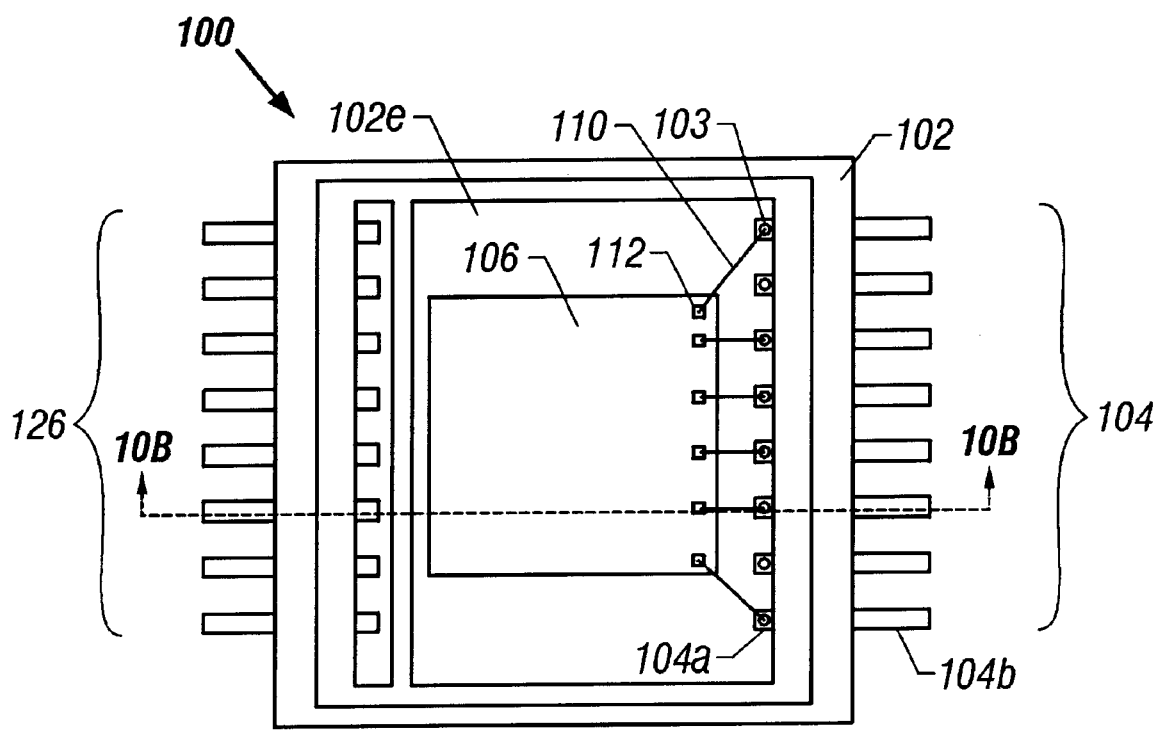
FIG. 10A shows a top view of an I.C. die attached to an open-tooled package and bond wires electrically coupling the I.C. die and the open-tooled package.
Figure 10B:
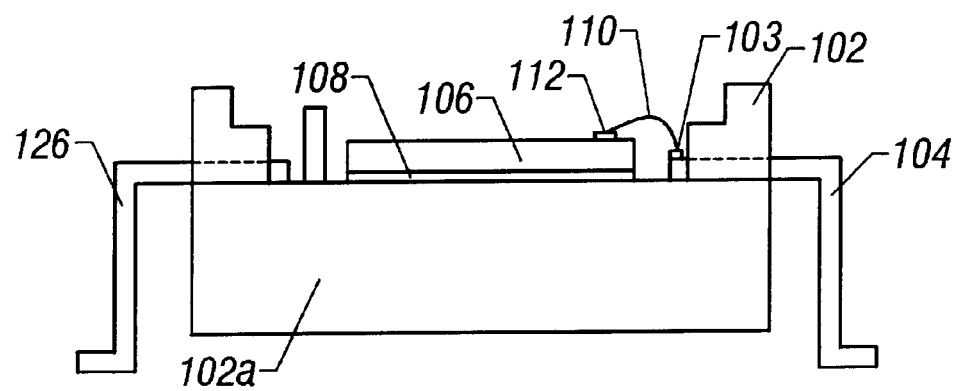
FIG. 10B shows a cross-sectional view of the device shown in FIG. 10A.

FIGS. 10A and 10B show a top view and a cross-sectional view of an I.C. die 106 attached to open-tooled package 100 and having electrical connections to leads 104. I.C. die 106 is attached to base 102a enclosed in cavity 102e of open-tooled package 100 with sealant 108 (shown in FIG. 10B). Die 106 is attached to base 102a using a precision die attachment process. Sealant 108 can be either conductive or non-conductive, since insulating substrate 102 is non-conductive. Electrically conductive epoxy, electrically non-conductive epoxy, and other adhesives can all be used for sealant 108. In one embodiment, a conductive epoxy ABLE-BOND® 84-1LMISR4, manufactured by Gateway Semiconductor International Corporation, is used. After die 106 is mounted, the conductive epoxy is cured at, e.g., approximately 150° C. for approximately 45 minutes following a 15-minute ramp from 100° C. to 150° C.

Next, bond pads 112 on I.C. die 106 are bonded to bonding terminals 103 on the bonding extension sections 104a of leads 104, respectively, to provide a conductive path from I.C. die 106 to the external lead sections 104b of leads 104. In one embodiment, bonding terminals 103 are bonded to corresponding bond pads 112 with bond wires 110 using a conventional wire-bonding process such as a high-frequency thermosonic bonding process. Bond wires 110 may be, for example, a 1.0 mil diameter gold wire or aluminum wire.

Figure 11A:
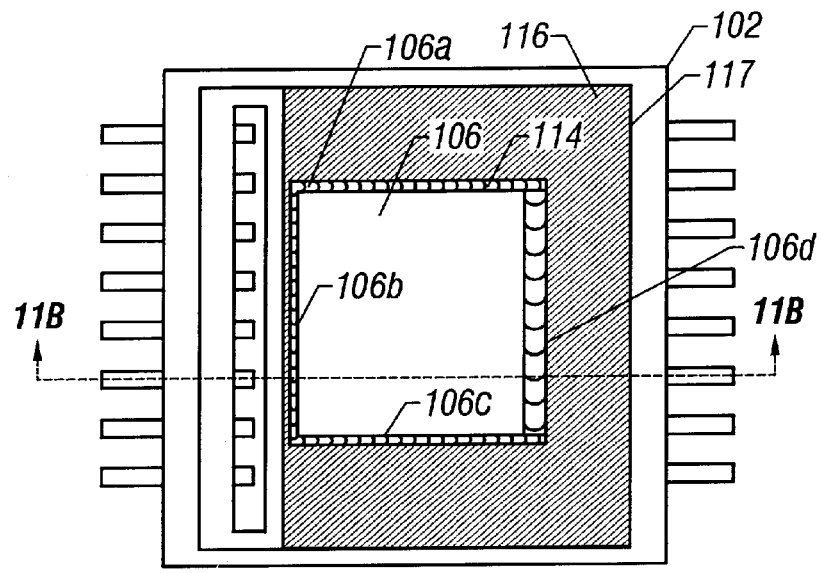
FIG. 11A shows a top view of the device after deposition of a non-conductive material.
Figure 11B:
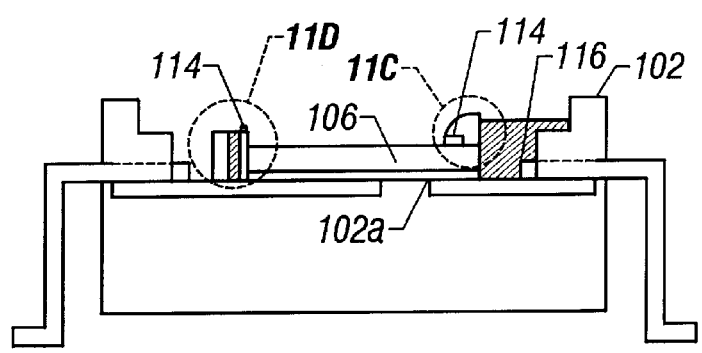
FIG. 11B shows a cross-sectional view of the device shown in FIG. 11A.

FIGS. 11A and 11B show a top view and a cross-sectional view, respectively, of package 100 after deposition of a non-conductive material into cavity 102e. In this embodiment, a "dam" 114 is used to prevent overspill of a fill material onto I.C. die 106. However, dam 114 is not required.

Figure 11C:
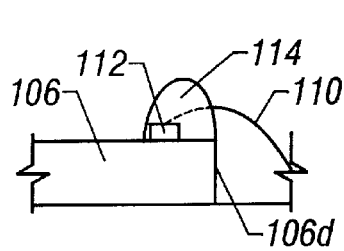
FIG. 11C shows a detailed view of the non-conductive material formed on the I.C. die.
Figure 11D:
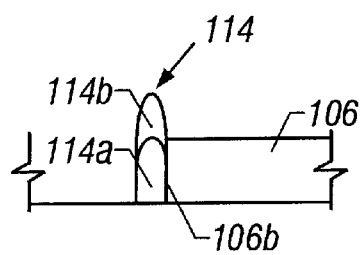
FIG. 11D shows a detailed view of the non-conductive material formed along the sidewalls of the I.C. die using dual damming technique.

In one embodiment, dam 114 is formed by depositing a line of beads of a non-conductive material, e.g., a non-conductive epoxy, adjacent sidewalls 106a, 106b, and 106c of die 106 and on top of I.C. die 106, over bond pads 112 and along edge 106d. In one embodiment, the non-conductive epoxy is HYSOL®FP4451 manufactured by Gateway Semiconductor International Corporation. Dam 114 is formed using e.g. a dual-head dispenser with fine needles, programmed to dispense at a certain range. In one embodiment, the dual-head dispenser is an Asymtek Century 708 manufactured by Asymtek. The dam material should be viscous enough to hold the shape of a 10-mil high dam. FIG. 11C shows a detailed view of dam 114 over bond pad 112 and adjacent edge 106d of I.C. die 106. Dam 114 is formed on top of I.C. chip 106 and over bond pad 112 to function as a sealant. FIG. 11D shows a detailed view of dam 114 on sidewalls 106a, 106b, and 106c of I.C. die 106. If the dispenser is not able to build a dam of the required height in one operation, a dual-dam can be built by dispensing a first line of beads 114a and then dispensing a second line of beads 114b over the first line of beads 114a, as shown in FIG. 11D.

The annular cavity between insulative substrate 102 and I.C. die 106 and dam 114 is then filled with a non-conductive material 116 using, e.g., dual-head dispensing equipment such as the Asymtek Century 708 manufactured by Asymtek. In one embodiment, the material used to fill the cavity is the same material as the material used to build dam 114, e.g., a non-conductive epoxy. If fill material 116 is of less viscosity then the dam material, fill material 116 has a better flow. However, a less viscous material can cause outgasing during the subsequent cure process, possibly forming voids, especially on the side with the bond pads. The voids create reliability concerns because they can allow moisture to enter the bonds.

Figure 11E:
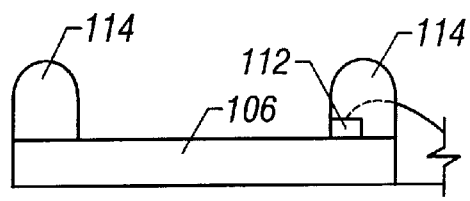
FIG. 11E shows an alternative embodiment of forming the dams.

In an alternative embodiment, dam 114 is formed around the edges and on top of I.C. die 106, as that shown in FIG. 11E.

Figure 12A:
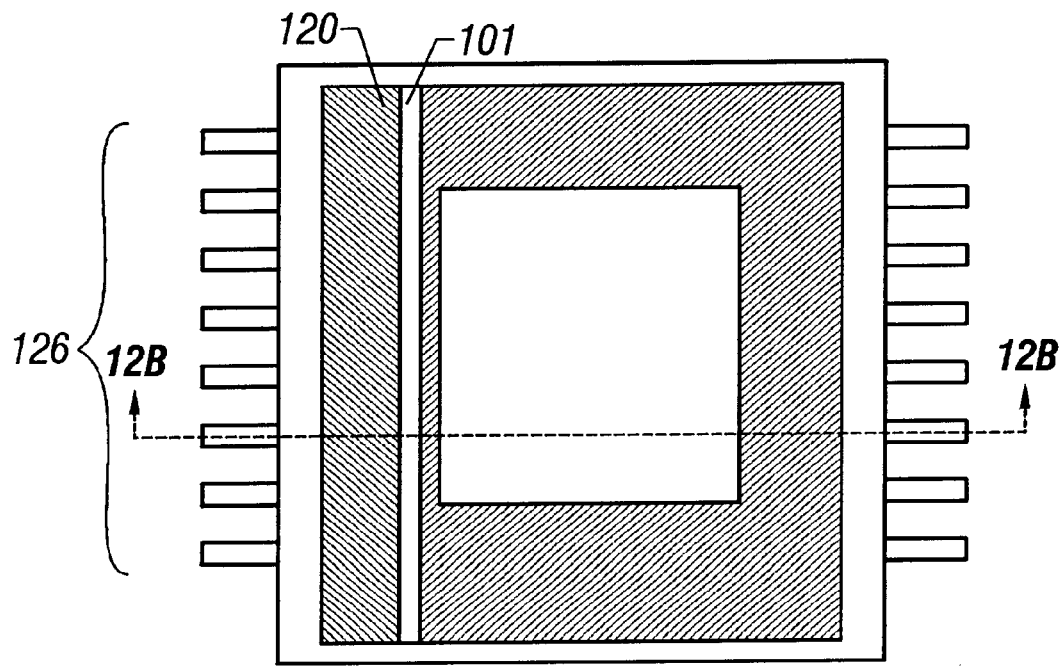
FIG. 12A shows a top view of the device after deposition of a conductive material.
Figure 12B:
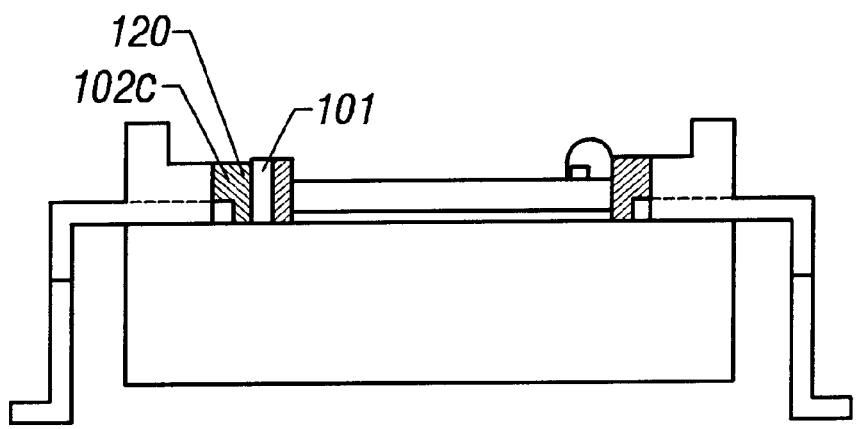
FIG. 12B shows a cross-sectional view of the device shown in FIG. 12A.

FIGS. 12A and 12B show a top view and a cross-sectional view, respectively, of package 100 after deposition of a conductive material 120 in cavity 102c. Since dam 101 is preformed in the substrate 102 of open-tooled package 100, no additional dam needs to be built. Alternatively, dam 101 can be fabricated by depositing a line of a non-conductive material, such as a non-conductive epoxy, in the manner described above with respect to dam 114. Cavity 102c is then filled with a conductive material 120, such as a conductive epoxy. In one embodiment, the conductive epoxy is the same material as the conductive epoxy used for die attach, e.g., ABLEBOND®84-1LMISR4. Conductive material 120 shorts all the leads 126 together, one of which being electrically coupled to ground potential. As discussed below, this will provide electrostatic discharge (ESD) protection for I.C. die 106.

The cavity between I.C. die 106 and substrate 102 is filled with a non-conductive material where the leads do not need to be shorted together for grounding purposes.

Figure 13A:
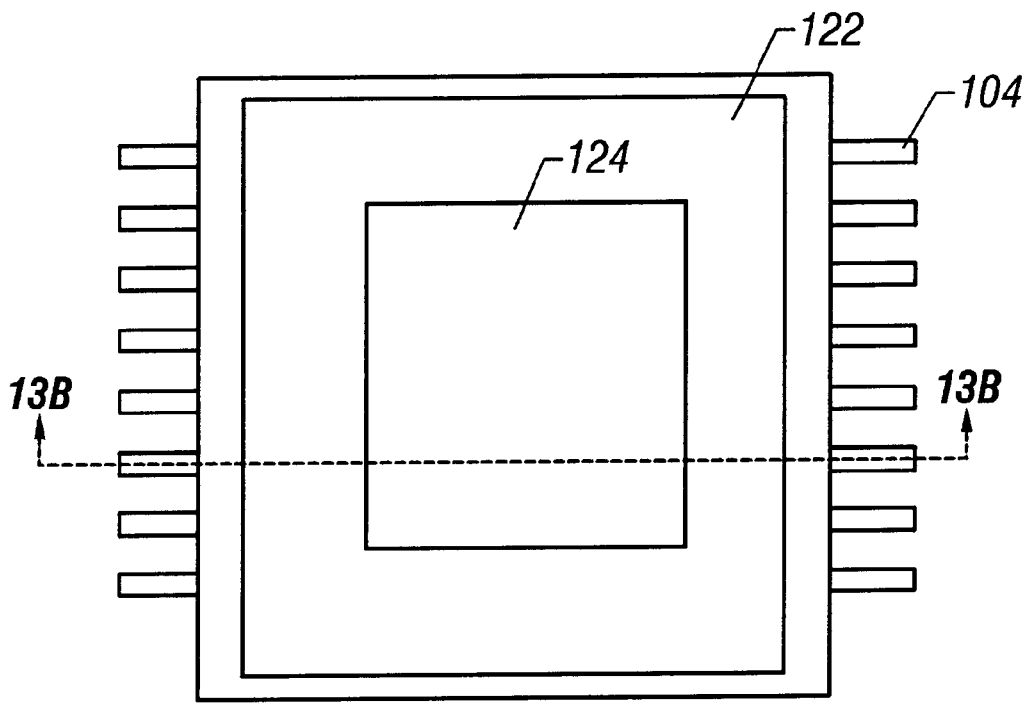
FIG. 13A shows a conductive ring attached to the structure of FIG. 12A.
Figure 13B:
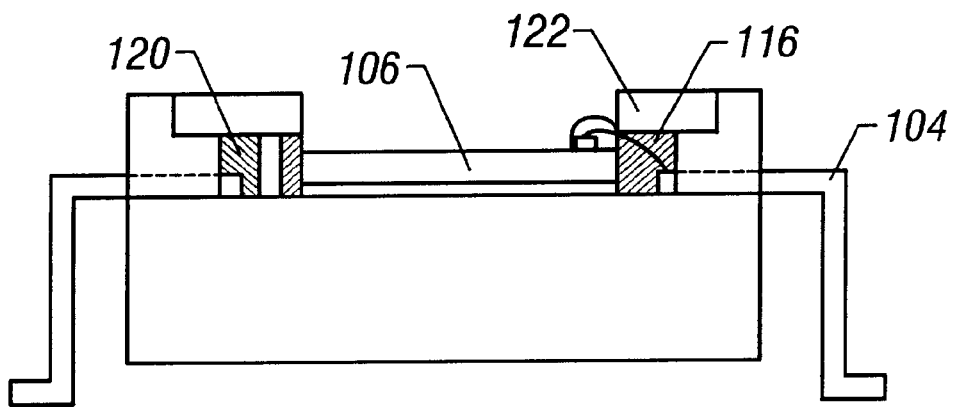
FIG. 13B shows a cross-sectional view of the device shown in FIG. 13A.

FIGS. 13A and 13B show a conductive ring 122 attached to the structure of FIG. 12A. A conductive ring 122 having a window 124, is attached onto the surface of the structure shown in FIG. 12A. Conductive ring 122 is made of a conductive material, such as, but not limited to, nickel plated beryllium copper. Beryllium copper is strong enough to form a thin plate without warpage and at the same time provides good electrical conductivity. Since conductive ring 122 is attached to conductive material 120, which is at a ground potential, conductive ring 122 is also grounded, hence it provides electrical shock protection from, for example, an electrostatic discharge from a finger that contacts the I.C. die 106. Conductive ring 122 is also attached to non-conductive material 116. Conductive material 120 and non-conductive material 116 also act as a sealant for conductive ring 122. The complete device is then cured at, for example, approximately 150° C. for 30 minutes, so that conductive ring 122 securely attaches to the open-tooled package 100.

Figure 14A:
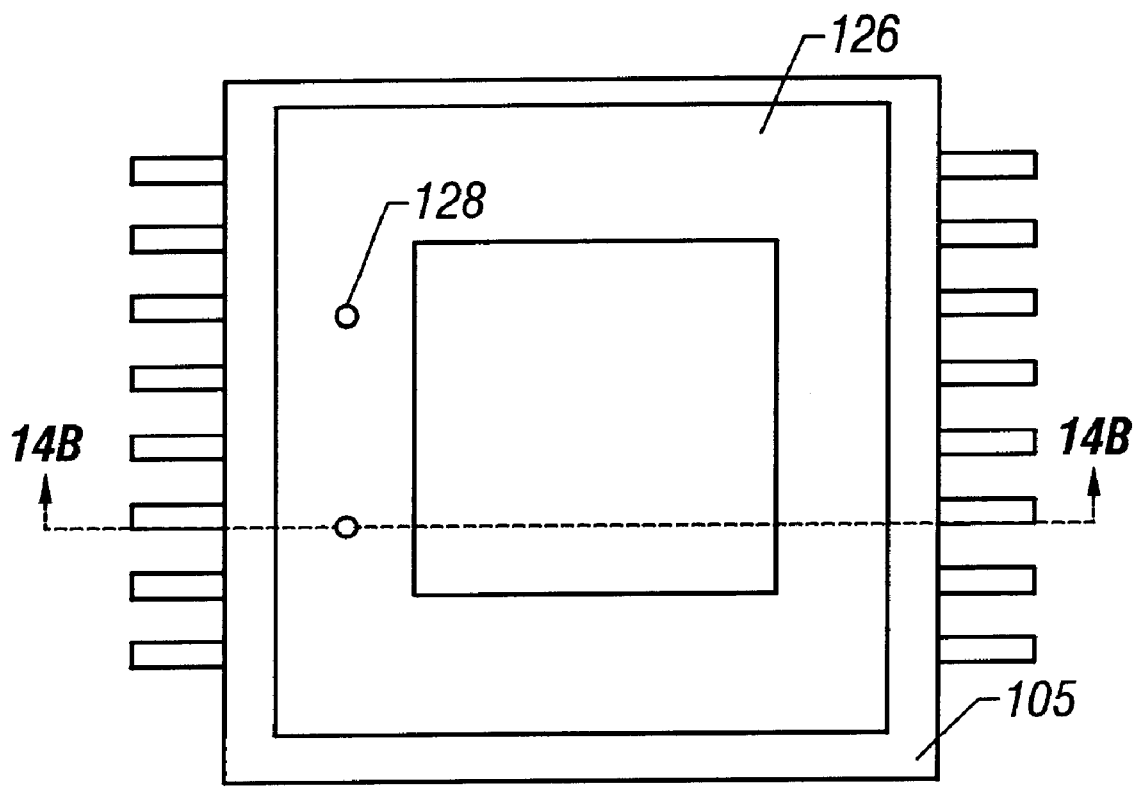
FIG. 14A shows a conductive ring having two holes for injection, attached to the structure of FIG. 11A.
Figure 14B:
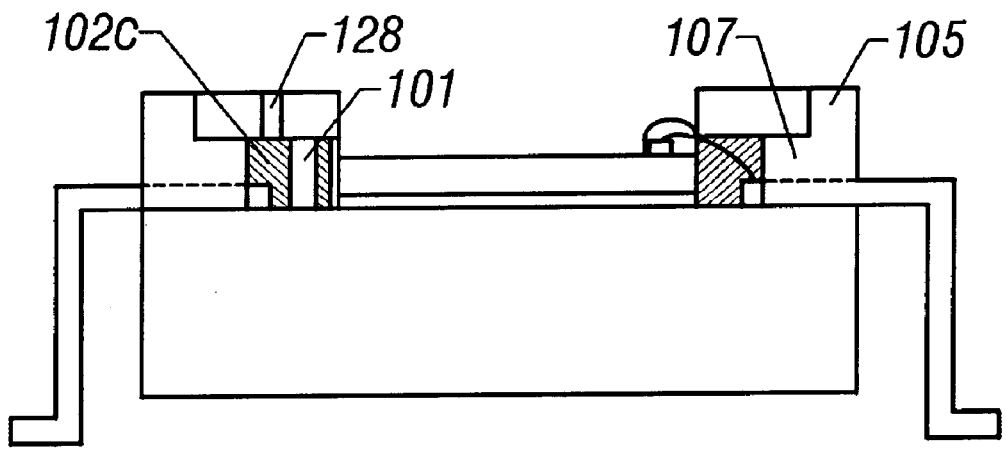
FIG. 14B shows a cross-sectional view of the device shown in FIG. 14A.

Another embodiment is shown in FIGS. 14A and 14B. The initial process is the same as that described for FIGS. 9A–9B, 10A–10B, and 11A–11D. The process described in FIGS. 12A and 12B, during which cavity 102c is filled with a conductive material 120, is skipped. Instead, a conductive ring 126 having at least one injection hole 128 is attached over the structure shown in FIGS. 11A–11D in the same manner as that described for conductive ring 122. Dam 101 and the step formed by outer frame 105 and inner frame 107 provide support for conductive ring 126. A conductive material is then injected into cavity 102c using, for example, a syringe. In one embodiment, the conductive material is a conductive epoxy. The conductive material is then cured.

Although the invention has been described with reference to particular embodiments, the description is only an example of the invention's application and should not be taken as a limitation. Various other adaptations and combinations of features of the embodiments disclosed are within the scope of the invention as defined by the following claims.

I claim:

1. A method for packaging an integrated circuit (I.C.) die, comprising:
   mounting an I.C. die on a base of an open-tooled package, said open-tooled package comprising a substrate, said substrate having said base, a plurality of sidewalls, and a plurality of leads extending through at least one of said sidewalls, said I.C. die having a plurality of bond pads;
   forming an electrical connection between at least one of said plurality of bond pads and a corresponding one of said plurality of leads;
   filling a first portion of a cavity with a first non-conductive material, said cavity being defined between said sidewalls and said I.C. die, said first non-conductive material contacting a first subset of said plurality of leads; and
   filling a second portion of said cavity with a first conductive material, said first conductive material contacting a second subset of said plurality of leads.

2. The method of claim 1, further comprising attaching a conductive ring to said open-tooled package, said conductive ring exposing a surface of said I.C. die.

3. The method of claim 2, wherein said conductive ring is electrically coupled to said first conductive material.

4. The method of claim 3, wherein said conductive ring is attached to said first non-conductive material.

5. The method of claim 2, wherein said conductive ring comprises nickel plated beryllium copper.

6. The method of claim 2, further comprising supporting said conductive ring on a step of said substrate, said substrate having a tiered structure.

7. The method of claim 1, wherein said mounting comprises precision die attachment.

8. The method of claim 1, wherein said mounting comprises:

depositing a die attach material on said base;

placing said I.C. die over said die attach material; and curing said die attach material.

9. The method of claim 8, wherein said die attach material is a non-conductive epoxy.

10. The method of claim 8, wherein said die attach material is a second conductive material.

11. The method of claim 10, wherein said second conductive material is the same material as said first conductive material.

12. The method of claim 1, wherein said substrate is non-conductive.

13. The method of claim 1, wherein said substrate comprises liquid crystal polymer.

14. The method of claim 1, wherein said substrate has approximately the same coefficient of thermal expansion as said I.C. die.

15. The method of claim 1, wherein said substrate has approximately the same coefficient of thermal expansion as silicon.

16. The method of claim 1, wherein said first non-conductive material comprises non-conductive epoxy.

17. The method of claim 1, wherein said first non-conductive material has a viscosity to form a bead of at least 10 mils.

18. The method of claim 1, wherein said first conductive material comprises conductive epoxy.

19. The method of claim 1, further comprising forming a dam adjacent to a sidewall of said I.C. die, said dam having a height greater than said I.C. die, said dam comprising a second non-conductive material.

20. The method of claim 19, wherein said forming a dam comprises:

forming a first dam adjacent to said sidewall of said I.C. die; and forming a second dam over said first dam.

21. The method of claim 19, wherein said second non-conductive material is the same material as said first non-conductive material.

22. The method of claim 1, further comprising:

forming a first dam adjacent an edge of said I.C. die and a portion of said plurality of bond pads, said portion of said plurality of bond pads being proximate to said edge of said I.C. die; and forming a second dam adjacent to each of said sidewalls, except said sidewall adjacent said edge, said second dam having a height greater than said I.C die.

23. The method of claim 22, wherein said first dam and said second dam comprise a second non-conductive material.

24. The method of claim 23, wherein said second non-conductive material is the same material as said first non-conductive material.

25. The method of claim 1, wherein said open-tooled package further comprises a dam extending from a first sidewall to a second sidewall, said dam separating said first portion of said cavity and said second portion of said cavity.

26. The method of claim 1, wherein said first non-conductive material surrounds said first subset of said plurality of leads.

27. The method of claim 1, further comprising electrically grounding said second subset of said plurality of leads, and wherein said first conductive material surrounds said second subset of said plurality of leads.

* * * * *

UNITED STATES PATENT AND TRADEMARK OFFICE
CERTIFICATE OF CORRECTION

PATENT NO.    : 6,331,452 B1                                              Page 1 of 1
DATED         : December 18, 2001
INVENTOR(S)   : Peter J. Gall It is certified that error appears in the above-identified patent and that said Letters Patent is hereby corrected as shown below:

Title page,
Change the assignee's name from "Verdicom, Inc." to -- Veridicom, Inc. --.

Signed and Sealed this

Twenty-third Day of April, 2002

Attest:

JAMES E. ROGAN
Attesting Officer    Director of the United States Patent and Trademark Office